(12) United States Patent
Rofougaran

(10) Patent No.: US 8,854,154 B2
(45) Date of Patent: *Oct. 7, 2014

(54) PROCESSING SIGNALS BY COUPLERS EMBEDDED IN AN INTEGRATED CIRCUIT PACKAGE

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 75 days.

This patent is subject to a terminal disclaimer.

(21) Appl. No.: 13/553,520

(22) Filed: Jul. 19, 2012

(65) Prior Publication Data

US 2012/0280763 A1 Nov. 8, 2012

Related U.S. Application Data

(63) Continuation of application No. 12/984,288, filed on Jan. 4, 2011, now Pat. No. 8,228,134, which is a continuation of application No. 12/036,512, filed on Feb. 25, 2008, now Pat. No. 7,863,998.

(51) Int. Cl.
*H01P 5/12* (2006.01)
*H01P 5/18* (2006.01)
*H01P 3/08* (2006.01)

(52) U.S. Cl.
CPC ..................................... *H01P 5/185* (2013.01)
USPC .......................................... 333/109; 333/116

(58) Field of Classification Search
USPC .................. 333/109, 110, 111, 112, 115, 116
See application file for complete search history.

(56) References Cited

U.S. PATENT DOCUMENTS

| 4,814,780 | A  | * | 3/1989  | Sterns et al. | 343/756 |
| 6,275,178 | B1 | * | 8/2001  | Koifman et al. | 341/143 |
| 7,321,276 | B2 | * | 1/2008  | Nichols | 333/109 |
| 7,605,767 | B2 | * | 10/2009 | Lee et al. | 343/705 |
| 7,741,187 | B2 | * | 6/2010  | Sarkar | 438/379 |
| 7,863,998 | B2 | * | 1/2011  | Rofougaran | 333/25 |
| 8,228,134 | B2 | * | 7/2012  | Rofougaran | 333/109 |

* cited by examiner

*Primary Examiner* — Dean O Takaoka
(74) *Attorney, Agent, or Firm* — Oblon, Spivak, McClelland, Maier & Neustadt, L.L.P.

(57) ABSTRACT

Methods and systems for processing signals via directional couplers embedded in a package are disclosed and may include generating via a directional coupler, one or more output RF signals that may be proportional to a received RF signal. The directional coupler may be integrated in a multi-layer package. The generated RE signal may be processed by an integrated circuit electrically coupled to the multi-layer package. The directional coupler may include quarter wavelength transmission lines, which may include microstrip or coplanar structures. The directional coupler may be electrically coupled to one or more variable capacitances in the integrated circuit. The variable capacitance may include CMOS devices in the integrated circuit. The directional coupler may include discrete devices, which may be surface mount devices coupled to the multi-layer package or may be devices integrated in the integrated circuit. The integrated circuit may be flip-chip bonded to the multi-layer package.

20 Claims, 6 Drawing Sheets

PROCESSING SIGNALS BY COUPLERS EMBEDDED IN AN INTEGRATED CIRCUIT PACKAGE

CROSS-REFERENCE TO RELATED APPLICATIONS/INCORPORATION BY REFERENCE

This is a continuation of application Ser. No. 12/984,288 filed Jan. 4, 2011.

This application is a continuation of U.S. application Ser. No. 12/036,512 filed Feb. 25, 2008.

FEDERALLY SPONSORED RESEARCH OR DEVELOPMENT

[Not Applicable]
[MICROFICHE/COPYRIGHT REFERENCE]
[Not Applicable]

FIELD OF THE INVENTION

Certain embodiments of the invention relate to wireless communication. More specifically, certain embodiments of the invention relate to a method and system for processing signals via directional couplers embedded in an integrated circuit package.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for processing signals via directional couplers embedded in an integrated circuit package, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for directional couplers embedded in an integrated circuit package. Exemplary aspects of the invention may comprise generating via a directional coupler, one or more output RF signals that may be proportional to a received RF signal. The directional coupler may be integrated in a multi-layer package. The directional coupler may comprise quarter wavelength transmission lines. The transmission lines may comprise a microstrip or coplanar structure. The directional coupler may be electrically coupled to one or more variable capacitances in the integrated circuit. The variable capacitance may comprise CMOS devices in the integrated circuit. The directional coupler may comprise discrete devices, which may be surface mount devices coupled to the multi-layer package or may be devices integrated in the integrated circuit. The integrated circuit may be flip-chip bonded to the multi-layer package.

Figure 1:
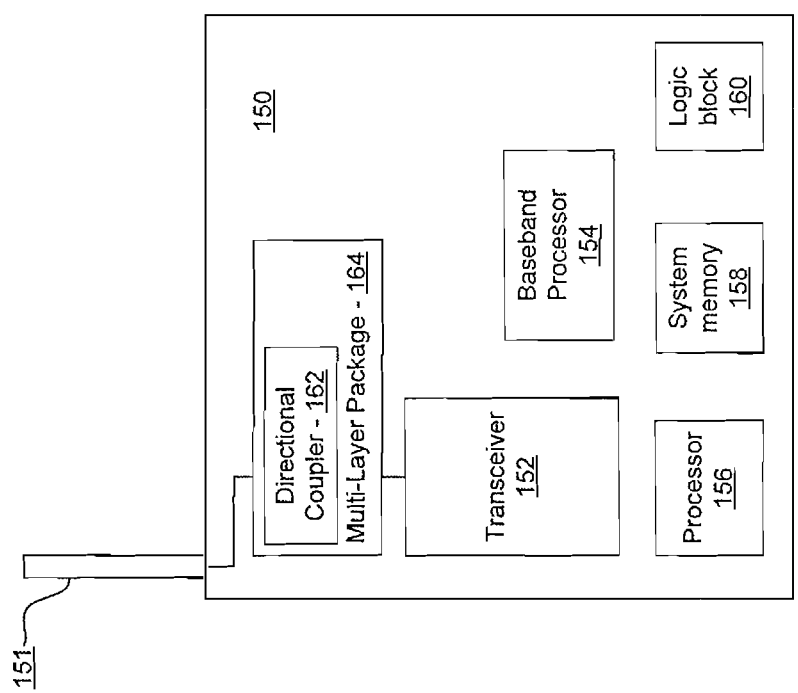
FIG. 1 is a block diagram of an exemplary wireless system, which may be utilized in accordance with an embodiment of the invention.

FIG. 1 is a block diagram of an exemplary wireless system, which may be utilized in accordance with an embodiment of the invention. Referring to FIG. 1, the wireless system 150 may comprise an antenna 151, a transceiver 152, a baseband processor 154, a processor 156, a system memory 158, a logic block 160, directional coupler 162, and a multi-layer package 164. The antenna 151 may be used for reception and/or transmission of RF signals. The wireless system 150 may comprise a wireless mobile terminal such as a handheld communication device. For example, the wireless system 150 may be a cellular telephone, or a Smartphone.

The transceiver 152 may comprise suitable logic, circuitry, and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151. Different wireless systems may use different antennas for transmission and reception. The transceiver 152 may be enabled to execute other functions, for example, filtering, coupling, and/or amplifying the baseband and/or RF signals. Although a single transceiver 152 is shown, the invention is not so limited. Accordingly, the transceiver 152 may be implemented as a separate transmitter and separate receiver. In addition, there may be a plurality transceivers, transmitters and/or receivers. In this regard, the plurality of transceivers, transmitters and/or receivers may enable the wireless system 150 to handle a plurality of wireless protocols and/or standards including cellular, WLAN and PAN.

The directional coupler 162 may comprise suitable circuitry, logic, and/or code that may enable coupling a fraction of an RF signal such that the power level of the RF signal to be transmitted and/or received by the antenna 151 may be monitored. The directional coupler 162 may be coupled between the transceiver 152 and the antenna 151. A directional coupler may enable the coupling of one or more signals from the transceiver 152 to the antenna 151. Other applications of directional couplers may comprise line monitoring, power measurements, load/source isolators, and phase/amplitude tracking, for example. The directional coupler 162 may be integrated within the multi-layer package 164.

The multi-layer package 164 may comprise multiple layers of insulator and conductive material for integrating multiple devices within the package. The multi-layer package 164 may enable the coupling of multiple devices to an integrated circuit.

The baseband processor 154 may comprise suitable logic, circuitry, and/or code that may be enabled to process baseband signals for transmission via the transceiver 152 and/or the baseband signals received from the transceiver 152. The processor 156 may be any suitable processor or controller such as a CPU or DSP, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

The system memory 158 may comprise suitable logic, circuitry, and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, and/or code that may enable controlling of various functionalities of the wireless system 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

In operation, control and/or data information, which may comprise the programmable parameters, may be transferred from other portions of the wireless system 150, not shown in FIG. 1, to the processor 156. Similarly, the processor 156 may be enabled to transfer control and/or data information, which may include the programmable parameters, to other portions of the wireless system 150, not shown in FIG. 1, which may be part of the wireless system 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The directional coupler 162 may be integrated into the integrated circuit package 164 in the wireless device 150, and may enable the power monitoring of one or more RF signals that may be transmitted and/or received by the antenna 151. The directional coupler 162 may comprise discrete devices and/or one or more quarter wavelength transmission lines, as described further with respect to FIGS. 2A-2C. Integrating directional couplers into an integrated circuit package may allow high performance devices with minimal volume/space usage.

Figure 2A:
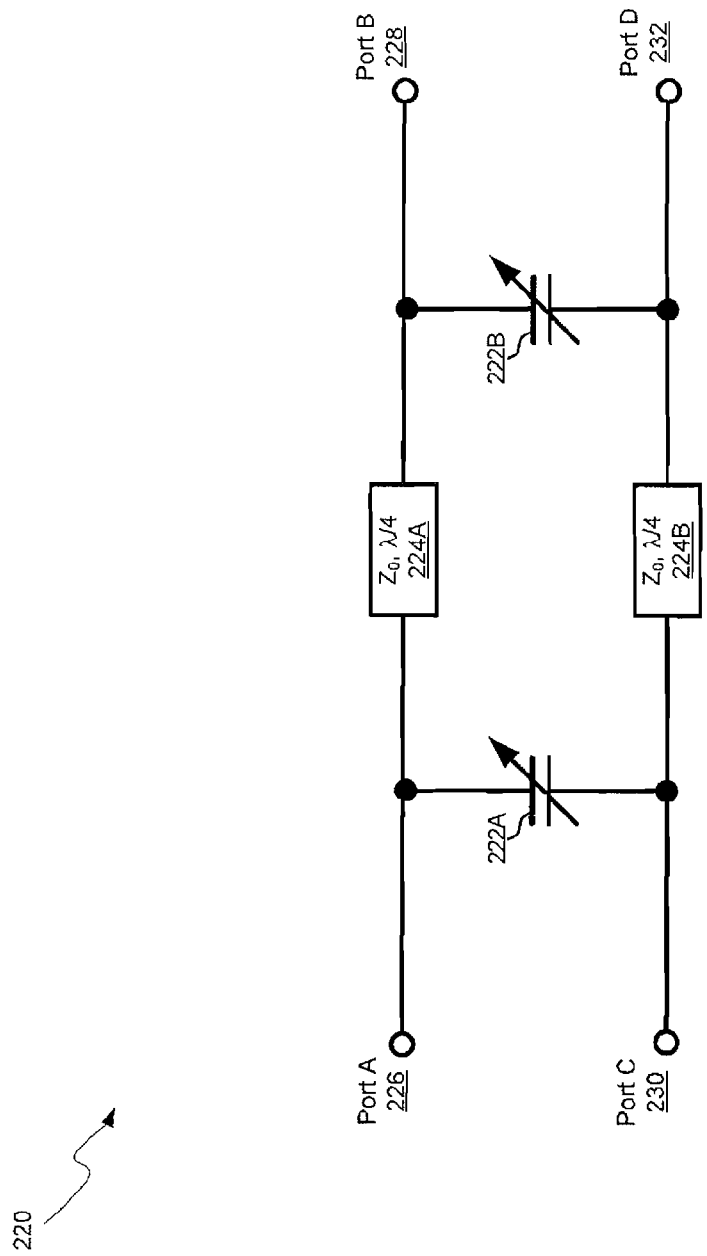
FIG. 2A is a block diagram of a transmission line directional coupler, in accordance with an embodiment of the invention.

FIG. 2A is a block diagram of a transmission line directional coupler, in accordance with an embodiment of the invention. Referring to FIG. 2A, there is shown a directional coupler 220 comprising quarter wavelength transmission lines 224A and 224B, and variable capacitors 222A and 222B. There is also shown port A 226, port B 228, port C 230, and port D 232.

The quarter wavelength transmission lines 224A and 224B may comprise distributed impedance structures for the propagation of RF signals, and with a length that may equal an integer multiple of one fourth of the wavelength of the RF signals to be communicated. In an embodiment of the invention, the structure length may comprise odd integer multiples of one fourth of the wavelength of the RF signal. The quarter wavelength transmission lines 224A and 224B may comprise a characteristic impedance that may be utilized along with the variable capacitances 222A and 222B to provide impedance matching between devices coupled to the inputs and the outputs of the directional coupler 220. The physical spacing between the quarter wavelength transmission lines 224A and 224B may determine the coupling strength of the directional coupler 220.

The variable capacitors 222A and 222B may comprise capacitors in an integrated circuit, such as an array of CMOS devices, for example. In another embodiment of the invention, the variable capacitors 222A and 222B may comprise one or more discrete capacitors integrated in an IC package that may be switched in or out of the directional coupler 220 via switches. In another embodiment of the invention, the discrete capacitors may be switched by MEMS switches integrated on the IC package, for example. Exemplary embodiments of the invention for integrating devices on an IC package is described further with respect to FIG. 2C.

In operation, an RF signal may be communicated to the port A 226, and the output signal may be communicated to the port B 228. A forward coupled RF signal may be communicated to the port C 230, and a reverse coupled RF signal may be communicated to the port D 232.

Alternatively, an input signal may be communicated to the port B 228 and an output signal may then be communicated from the port A 226. In this manner, the forward and reverse coupled signals from the port C 230 and the port D 232 may be utilized to measure the power of the input signal communicated to the port A 226 and/or the port B 228.

Additionally, the directional coupler 220 may provide load and source isolation. The variable capacitors 222A and 222B may be configured to change the directional characteristics of the directional coupler 220 such that signals propagating in opposite directions may have different coupling efficiencies. The impedance configuration may also minimize reflections at the port connections of the directional coupler 220. By integrating the directional coupler in an integrated circuit package that may be flip-chip bonded to an integrated circuit, parasitic impedances may be significantly reduced, reducing the insertion loss of the directional coupler 220.

Figure 2B:
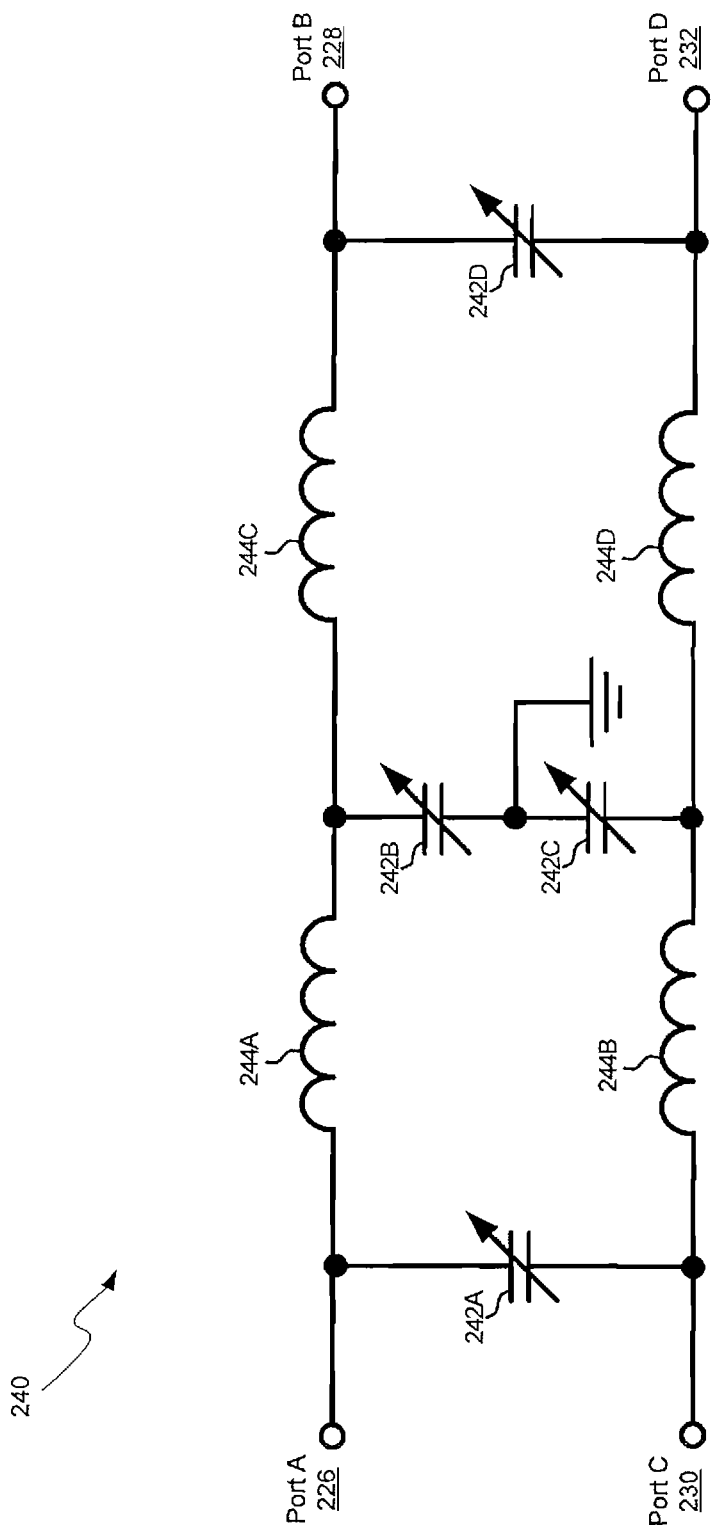
FIG. 2B is a block diagram illustrating an exemplary discrete directional coupler, in accordance with an embodiment of the invention.

FIG. 2B is a block diagram illustrating an exemplary discrete directional coupler, in accordance with an embodiment of the invention. Referring to FIG. 2B, there is shown a discrete directional coupler 240 comprising inductors 244A, 244B, 244C, and 244D and the variable capacitors 242A, 242B, 242C, and 242D. There is also shown the port A 226, port B 228, port C 230, and port D 232, which may be as described with respect to FIG. 2A.

The variable capacitors 242A, 242B, 242C, and 242D may be substantially similar to the variable capacitors 222A and 222B described with respect to FIG. 2A. The inductors 244A, 244B, 244C, and 244D may comprise discrete inductors integrated in an IC package, or as surface mount devices coupled to an IC package, for example. Exemplary embodiments of the invention for integrating devices on an IC package is described further with respect to FIG. 2C.

In operation, an RF signal may be communicated to the port A 226, and the output signal may be communicated to the port B 228. A forward coupled RF signal may be communicated to the port C 230, and a reverse coupled RF signal may be communicated to the port D 232, which may comprise an isolated port in this instance. Alternatively an input signal may be communicated to the port B 228 and an output signal may then be communicated from the port A 226. In this manner, the forward and reverse coupled signals from the port C 230 and the port D 232 may be utilized to measure the power of the input signal communicated to the port A 226 and/or the port B 228.

Additionally, the directional coupler 240 may provide load and source isolation. The variable capacitors 242A, 242B, 242C, and 242D may be configured to change the directional characteristics of the directional coupler 240 such that signals propagating in opposite directions may have different coupling efficiencies. The impedance configuration may also minimize reflections at the port connections of the directional coupler 240.

Figure 2C:
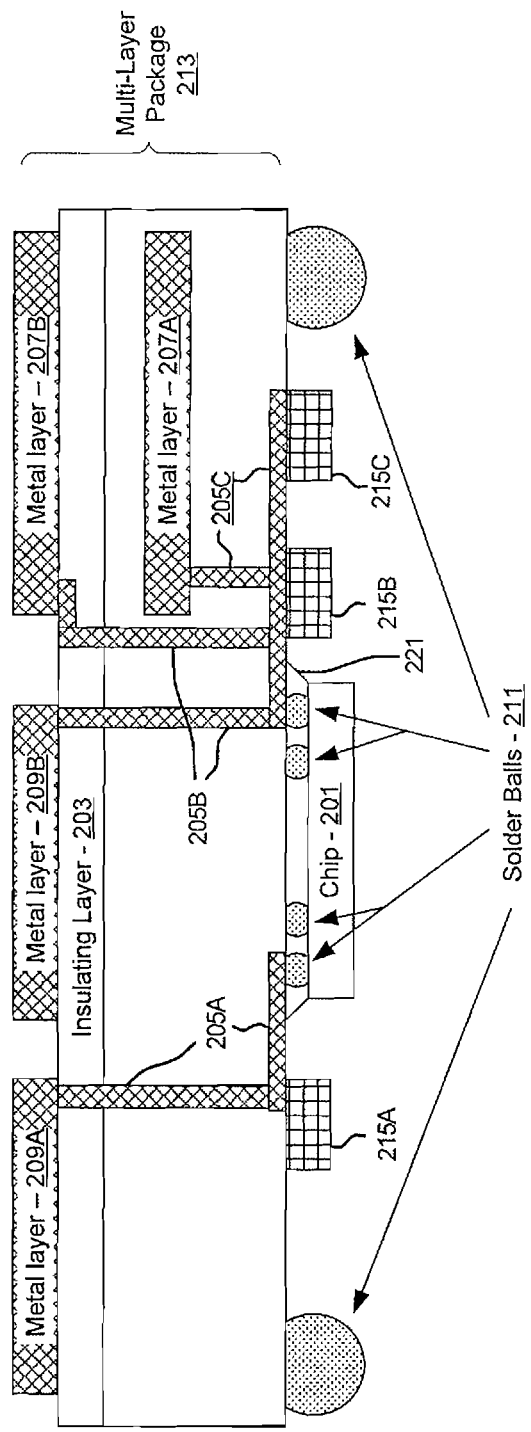
FIG. 2C is a block diagram illustrating a cross-sectional view of a multi-layer package with directional couplers, in accordance with an embodiment of the invention.

FIG. 2C is a block diagram illustrating a cross-sectional view of a multi-layer package with directional couplers, in accordance with an embodiment of the invention. Referring to FIG. 2C, there is shown a chip 201, an insulating layer 203, metal layers 205A, 205B, 205C, 207A, 207B, 209A, and 209B, solder balls 211, a multi-layer package 213, surface mount components 215A, 215B, and 215C, and thermal epoxy 221.

The chip 201, or integrated circuit, may comprise the transceiver 152 described with respect to FIG. 1, or any other integrated circuit within the wireless system 150 that may require directional couplers. The chip 201 may be bump-bonded or flip-chip bonded to the multi-layer package 213 utilizing the solder balls 211. In this manner, wire bonds connecting the chip 201 to the multi-layer package 213 may be eliminated, reducing and/or eliminating uncontrollable stray inductances due to wire bonds. In addition, the thermal conductance out of the chip 201 may be greatly improved utilizing the solder balls 211 and the thermal epoxy 221. The thermal epoxy 221 may be electrically insulating but thermally conductive to allow for thermal energy to be conducted out of the chip 201 to the much larger thermal mass of the multilayer package 213.

The metal layers 205A, 205B, 205C, 207A, 207B, 209A, and 209B may comprise deposited metal layers utilized to delineate directional couplers and other devices. The metal layers 207A, 207B, 209A, and 209B may be patterned such that they may comprise transmission lines that may be utilized in directional couplers for RF signals transmitted and/or received by the antenna 151 and communicated to and/or from the chip 201. The metal layers 209A and 209B may comprise a coplanar transmission line structure and the metal layers 207A and 207B may comprise a microstrip transmission line structure.

In another embodiment of the invention, one or more of the metal layers 207A, 207B, 209A, and 209B may comprise ferromagnetic and/or ferrimagnetic layers utilized to define devices such as transformers, inductors, baluns, isolators, circulators, and gyrators.

The metal layers 205A, 205B, and 205C may provide electrical contact from the transmission line structures and the surface mount devices 215A, 215B, and 215C to the chip 201 via the solder balls 211. The number of metal layers may not be limited to the number of metal layers 205A, 205B, 205C, 207A, 207B, 209A, and 209B shown in FIG. 2C. Accordingly, there may be any number of layers embedded within and/or deposited on the multi-layer package 213, depending on the number of contacts on the chip 201 coupled to the solder balls 211, and the number of directional couplers and other devices fabricated within and/or on the multi-layer package 213.

The solder balls 211 may comprise spherical balls of metal to provide electrical, thermal and physical contact between the chip 201 and the multi-layer package 213. In making the contact with the solder balls 211, the chip may be pressed with enough force to squash the metal spheres somewhat, and may be performed at an elevated temperature to provide suitable electrical resistance and physical bond strength. The thermal epoxy 221 may fill the volume between the solder balls 211 and may provide a high thermal conductance path for heat transfer out of the chip 201. The solder balls 211 may also be utilized to provide electrical, thermal and physical contact between the multi-layer package 213 and a printed circuit board comprising other parts of the wireless system 150, described with respect to FIG. 1.

The surface mount devices 215A, 215B, and 215C may comprise discrete circuit elements such as resistors, capacitors, inductors, and diodes, for example. The surface mount devices 215A, 215B, and 215C may be soldered to the multi-layer package 213 to provide electrical contact.

In operation, the chip 201 may comprise an RF front end, such as the RF transceiver 152, described with respect to FIG. 1, and may be utilized to transmit and receive RF signals. The chip 201 may be electrically coupled to directional couplers or other devices fabricated on and/or within the multi-layer package 213, such as transformers, baluns, transmission lines, inductors, capacitors, microstrip filters, coplanar waveguide filters and surface mount devices, for example.

Heat from the chip 201 may be conducted to the multi-layer package via the thermal epoxy 221 and the solder balls 211. In an embodiment of the invention, an array of capacitors in the chip 201 may be used in conjunction with directional couplers and devices other in and/or on the multi-layer package 213. In this manner, directional coupler performance may be significantly improved by allowing tuning of the coupling efficiency. Additionally, coupling the chip 201 to the multi-layer package 213 may significantly reduced parasitic impedances, thus reducing insertion losses of the directional couplers 220 and 240.

Figure 3:
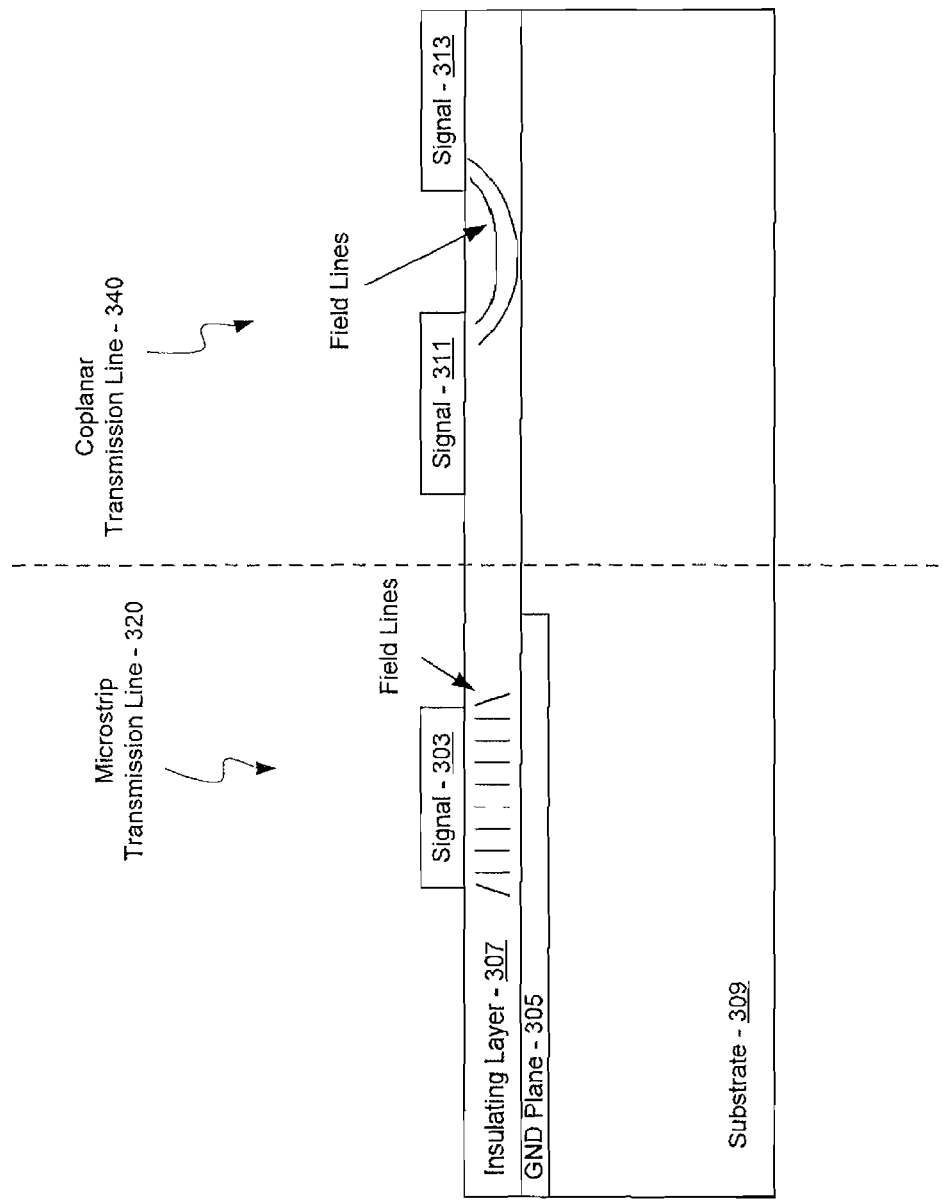
FIG. 3 is a block diagram illustrating a cross-sectional view of coplanar and microstrip transmission lines, in accordance with an embodiment of the invention.

FIG. 3 is a block diagram illustrating a cross-sectional view of coplanar and microstrip transmission lines, in accordance with an embodiment of the invention. Referring to FIG. 3, there is shown a microstrip transmission line 320. The microstrip transmission line 320 may comprise a signal conductive line 303, a ground plane 305, an insulating layer 307 and a substrate 309. The coplanar transmission line 340 may comprise signal conductive lines 311 and 313, the insulating layer 307, and the substrate 309.

The signal conductive line 303 may comprise metal traces deposited in and/or on the insulating layer 307. The length of the signal conductive line 303 may correspond to an odd integer factor of one fourth of the wavelength of the RF signal to be propagated through the microstrip transmission line 320. In another embodiment of the invention, the signal conductive lines 303, 311, and 313 may comprise poly-silicon or other conductive material. The separation and the voltage potential between the signal conductive line 303 and the ground plane 305 may determine the electric field generated therein. In addition, the dielectric constant of the insulating layer 307 may also determine the electric field between the signal conductive line 303 and the ground plane 305.

The insulating layer 307 may comprise $SiO_2$ or other insulating material that may provide a high resistance layer between the signal conductive lines 303, 311, and 313 and the ground plane 305 and/or the substrate 309. In addition, the insulating layer 307 may provide a means for configuring the electric field between the signal conductive line 303 and the ground plane 305 by the selection of a material with an appropriate dielectric constant.

The coplanar transmission line 340 may comprise the signal conductive lines 311 and 313 and the insulating layer 307. A signal may be propagated through the coplanar transmission line 340 by applying a signal voltage across the signal conductive lines 311 and 313. The length of the signal conductive lines 311 and 313 may correspond to an integer factor of one fourth of the wavelength of the RF signal to be propagated through the coplanar transmission line 340. The thickness and the dielectric constant of the insulating layer 307 may determine the electric field strength generated by the propagating signal. The spacing between the signal conductive lines 311 and 313 may determine the coupling factor of the directional coupler comprising the coplanar transmission line 340, such as the directional coupler 220 described with respect to FIG. 2A.

The substrate 309 may comprise a semiconductor or insulator material that may provide mechanical support for the microstrip transmission line 320, the coplanar transmission line 340, and other devices that may be integrated. The substrate 309 may comprise the multi-layer package 213, described with respect to FIG. 2C. In another embodiment of the invention, the substrate 309 may comprise Si, GaAs, sapphire, InP, GaO, ZnO, CdTe, CdZnTe and/or $Al_2O_3$, for example, or any other substrate material that may be suitable for integrating microstrip structures.

in operation, an AC signal may be applied across the signal conductive line 303 and the ground plane 305, and/or the signal conductive lines 311 and 313. The microstrip transmission line 320 and/or the coplanar transmission line 340 may propagate an RF signal that may be communicated to the directional coupler 220, described with respect to FIG. 2A. The wavelength of the received RF signal may correspond to the length of the signal conductive lines 303, 311, and 313. In this manner, a reverse and/or forward coupled RF signal may be measured at the coupled output ports of the directional couple 220. Accordingly, a power level of the communicated RF signal may be measured without altering the characteristics of the signal, other than a reduction in magnitude of the signal, corresponding to a coupling efficiency.

Figure 4:
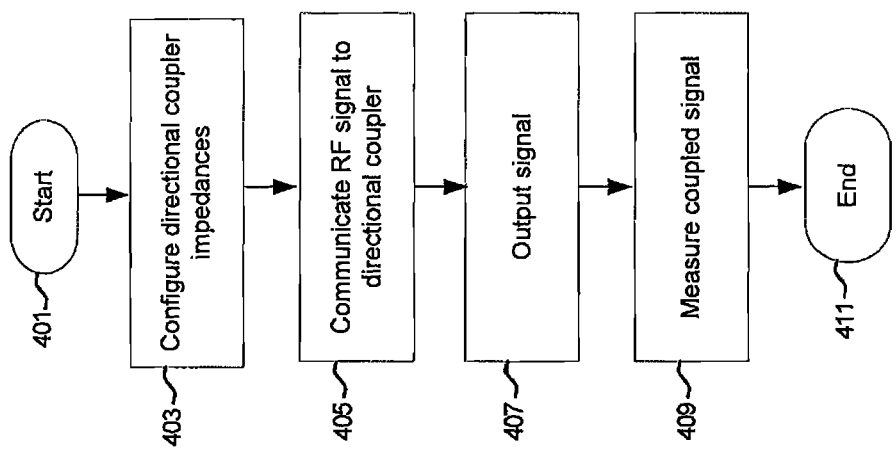
FIG. 4. is a block diagram illustrating exemplary steps in the operation of a directional coupler integrated in a multi-layer package, in accordance with an embodiment of the invention.

FIG. 4. is a block diagram illustrating exemplary steps in the operation of a directional coupler integrated in a multi-layer package, in accordance with an embodiment of the invention. In step 403, after start step 401, the impedances of the directional coupler may be configured to provide proper impedance matching and minimal signal reflection. In step 405, an RF signal may be communicated to the directional coupler followed by step 407, where the output signal may be generated. In step 409, the output RF signal may be measured, followed by end step 411.

In an embodiment of the invention, a method and system are disclosed for generating via a directional coupler 220, 240, one or more output RE signals that may be proportional to a received RF signal. The directional coupler 220, 240 may be integrated in a multi-layer package 213. The generated RF signal may be processed by an integrated circuit 201 electrically coupled to the multi-layer package 213. The directional coupler 220 may comprise quarter wavelength transmission lines 224A and 224B. The transmission lines 224A and 224B may comprise a microstrip or coplanar structure. The directional coupler 220, 240 may be electrically coupled to one or more variable capacitances 222A, 222B, 242A, 242B, 242C, and 242D in the integrated circuit 201. The variable capacitances 222A, 222B, 242A, 242B, 242C, and 242D may comprise CMOS devices in the integrated circuit 201. The directional coupler 240 may comprise discrete devices, which may be surface mount devices 215A, 215B, and 215C coupled to the multi-layer package 213 or may be devices integrated in the integrated circuit 201. The integrated circuit 201 may be flip-chip bonded to the multi-layer package 213.

Certain embodiments of the invention may comprise a machine-readable storage having stored thereon, a computer program having at least one code section for wireless communication, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A system for processing signals in an integrated circuit package, said system comprising:
    said integrated circuit package comprising a coupler operable to generate an output RF signal proportional to a received RF signal, said coupler including a signal path for said received RF signal, and an output port for providing said output RF signal;
    an integrated circuit in said integrated circuit package and configured to measure said output RF signal;
    one or more variable capacitors electrically coupling said signal path of said coupler to said output port of said coupler, wherein said coupler is configured by adjusting said one or more variable capacitors.

2. The system of claim 1, wherein said coupler is a directional coupler.

3. The system of claim 1, wherein said coupler is configured by adjusting an impedance of said coupler.

4. The system of claim 1, wherein said integrated circuit is in a flip-chip bonded to said integrated circuit package.

5. The system of claim 1, wherein said coupler comprises discrete devices.

6. The system of claim 5, wherein said discrete devices comprise surface mount devices disposed on said integrated circuit package.

7. The system of claim 1, wherein said coupler comprises one or more transmission lines.

8. The system of claim 1, wherein said coupler comprises one or more transmission lines, each having a length approximately equal to an integer multiple of one fourth of a wavelength of said received RF signal.

9. The system of claim 7, wherein said one or more transmission lines comprise coplanar transmission line structures.

10. The system of claim 7, wherein said one or more transmission lines comprise microstrip transmission line structures.

11. The system of claim 7, wherein said one or more transmission lines comprise ferromagnetic or ferrimagnetic layers.

12. The system of claim 1, wherein said coupler comprises a plurality of discrete inductors.

13. The system of claim 1, wherein said one or more variable capacitors comprise CMOS devices.

14. The system of claim 1, wherein a thermal epoxy is disposed between said integrated circuit package and said integrated circuit.

15. A method for processing signals in an integrated circuit package, said method comprising:
    configuring a coupler integrated in said integrated circuit package by adjusting one or more variable capacitors electrically coupling a signal path for a received RF signal of said coupler to an output port of said coupler for providing an output RF signal proportional to said received RF signal;
    generating said output RF signal proportional to said received RF signal utilizing said coupler;
    measuring said output RF signal utilizing an integrated circuit integrated with said integrated circuit package.

16. The method of claim 15, wherein said coupler is a directional coupler.

17. The method of claim 15, wherein said configuring said coupler is performed by adjusting an impedance of said coupler.

18. The method of claim 15, wherein said integrated circuit is in a flip-chip bonded to said integrated circuit package.

19. The method of claim 15, wherein said coupler comprises discrete devices.

20. The method of claim 15, wherein said coupler comprises one or more transmission lines.

* * * * *